US008723600B1

(12) United States Patent
Cagdaser et al.

(10) Patent No.: US 8,723,600 B1
(45) Date of Patent: May 13, 2014

(54) CANCELLATION OF DYNAMIC OFFSET IN MOS RESISTORS

(71) Applicant: Invensense, Inc., Sunnyvale, CA (US)

(72) Inventors: Baris Cagdaser, Sunnyvale, CA (US); Du Chen, San Jose, CA (US)

(73) Assignee: Invensense, Inc., San Jose, CA (US)

( * ) Notice: Subject to any disclaimer, the term of this patent is extended or adjusted under 35 U.S.C. 154(b) by 0 days.

(21) Appl. No.: 13/775,057

(22) Filed: Feb. 22, 2013

Related U.S. Application Data

(60) Provisional application No. 61/721,376, filed on Nov. 1, 2012.

(51) Int. Cl.
*H03F 3/45* (2006.01)

(52) U.S. Cl.
USPC .......................................... 330/259; 330/277

(58) Field of Classification Search
USPC .................................. 330/259, 277, 285, 296
See application file for complete search history.

(56) References Cited

U.S. PATENT DOCUMENTS

| 3,943,286 | A * | 3/1976 | Tsurushima | 330/277 |
| 7,345,545 | B2 * | 3/2008 | Glass et al. | 330/277 |
| 7,489,194 | B2 * | 2/2009 | Hajimiri et al. | 330/277 |

OTHER PUBLICATIONS

"CMOS Analaog integrated circuits based on weak inversion ," E. Vittoz, J. Fellrath, IEEE Journal of Solid-state Circuits, Jun. 1977, vol. 12, Issue 3, p. 224-231.
Eric Vitto and Jean Fellrath; "CMOS analog Integrated Circuits Based on Weak Inversion Operation"; IEE Journal of Solid-State Circuits, vol., SC-12, No. 3, Jun. 1977.

* cited by examiner

*Primary Examiner* — Henry Choe
(74) *Attorney, Agent, or Firm* — Maryam Imam; IPxLAW Group LLP

(57) ABSTRACT

A circuit utilizes a MOS device in a triode mode of operation and includes a biasing circuit and a MOS device. The MOS device has a drain, a source, and a gate terminal, and is coupled to the biasing circuit. The source terminal, drain terminal, and gate terminal each has a potential and the drain and the source terminals have a resistance. The biasing circuit couples the drain and source terminals of the MOS device to the gate terminal of the MOS device. The biasing circuit couples a DC potential to the gate terminal to adjust the resistance between the source and drain terminals of the MOS device. The resistance between the source and drain terminals is a non-linear function of voltage potentials at the source and drain terminals. The biasing circuit reduces the non-linearity of the resistance between the drain and source terminals by modulating the potential at the gate terminal by a combination of source and drain terminal potentials.

19 Claims, 7 Drawing Sheets

CANCELLATION OF DYNAMIC OFFSET IN MOS RESISTORS

CROSS REFERENCE TO RELATED APPLICATIONS

This application claims priority to U.S. Provisional Application No. 61/721,376 filed on Nov. 1, 2012, by Baris Cagdaser, and entitled "Cancellation of Dynamic Offset in MOS Resistors".

BACKGROUND

MOS devices can serve as resistors when used in the triode region of operation. Even though, they have certain advantages such as trimmability, small area, and potential to achieve very large values, MOS resistors are also non-linear due to MOS I-V characteristics. Non-linear behavior can cause undesired effects such as intermodulation between signals at terminals of the MOS resistor. One adverse outcome of the intermodulation is undesired DC offset across the MOS resistor, when it is subject to AC signals.

There is thus a need for a method and apparatus for eliminating DC producing intermodulation, hence, preventing complications such as loss of dynamic range in the circuit utilizing the MOS resistor.

SUMMARY

Briefly, an embodiment of the invention includes a circuit that uses a MOS device in a triode mode of operation and further includes a biasing circuit. The MOS device has a drain, a source, and a gate terminal, and is coupled to the biasing circuit. The source terminal, drain terminal, and gate terminal each has a potential and the drain and the source terminals have a resistance in between. The biasing circuit couples the drain and source terminals of the MOS device to the gate terminal of the MOS device. The biasing circuit further couples a variable DC potential to the gate terminal to adjust the resistance between the source and drain terminals of the MOS device. The resistance between the source and drain terminals is a non-linear function of voltage potentials at the source and drain terminals. The biasing circuit reduces the non-linearity of the resistance between the drain and source terminals by modulating the potential at the gate terminal by a combination of source and drain terminal potentials.

A further understanding of the nature and the advantages of particular embodiments disclosed herein may be realized by reference of the remaining portions of the specification and the attached drawings.

DETAILED DESCRIPTION OF EMBODIMENTS

The following describes a circuit utilizes a MOS device operated in a triode mode of operation to serve as a resistor. The MOS device has a drain, a source, and a gate terminal, and is coupled to the biasing circuit. The source terminal, drain terminal, and gate terminal each has a potential and the drain and the source terminals have a resistance in between. The biasing circuit couples the drain and source terminals of the MOS device to the gate terminal of the MOS device. The biasing circuit further couples a variable DC potential to the gate terminal to adjust the resistance between the source and drain terminals of the MOS device. The resistance between the source and drain terminals is a non-linear function of voltage potentials at the source and drain terminals. The biasing circuit reduces the non-linearity of the resistance between the drain and source terminals by modulating the potential at the gate terminal by a combination of source and drain terminal potentials.

In accordance with an embodiment of the invention, a biasing circuit eliminates DC producing intermodulation, hence, preventing complications such as loss of dynamic range in the host circuit utilizing the MOS resistor.

Figure 1:
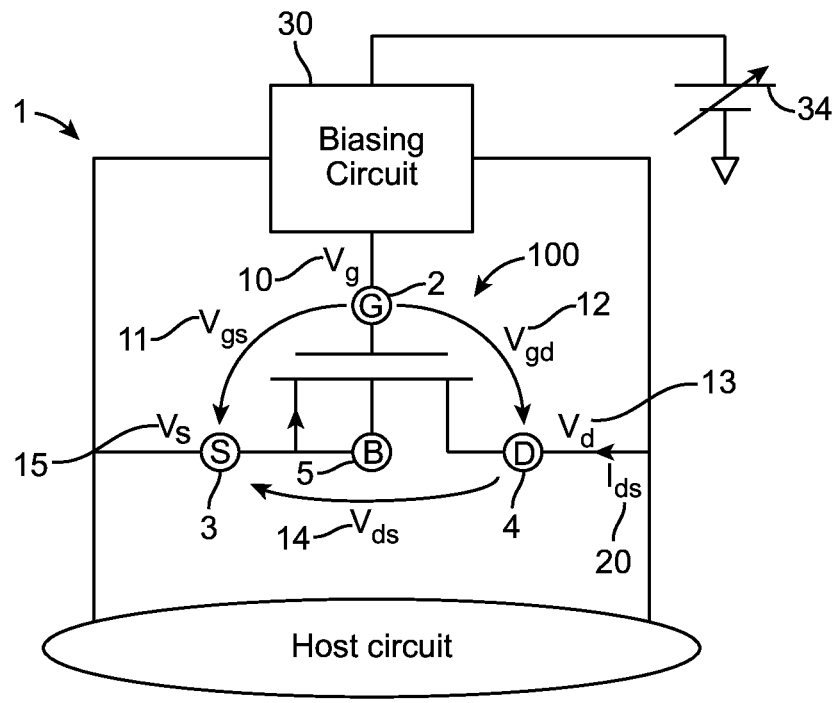
FIG. 1 shows a PMOS device, used as a MOS resistor, in accordance with an embodiment of the invention.

Referring now to FIG. 1, a PMOS device 1 is shown to be used as a MOS resistor, in accordance with an embodiment of the invention. The PMOS device 1 is a PMOS transistor, in an exemplary embodiment of the invention and is shown in FIG. 1 to include a transistor 100 that behaves as a variable resistor and also referred to herein as a "MOS transistor", "MOS resistor", or "MOS device", and a biasing circuit 30 that is coupled to a variable voltage 34. The PMOS device 1 is shown to be used by a host circuit, such as but not limited to MEMS interface electronics.

The transistor 100 is shown to include four terminals/nodes, i.e. a source 3, a bulk 5, a drain 4, and a gate 2. The source 3, drain 4, and the gate 2 each has a potential or voltage associated with it and there is also a distinct potential across two neighboring gates. For example, the potential at the source 3 is indicated, in FIG. 1, as $V_s$ 15, the potential at the drain 4 is indicated as $V_d$ 13, and the potential at the gate 2 is indicated as $V_g$ 10. The potential across the source 3 and the drain 4 is indicated as $V_{ds}$ 14, the potential across the source 3 and the gate 2 is indicated as $V_{gs}$ 11, and the potential across the gate 2 and the drain 4 is indicated as $V_{gd}$ 12.

In the embodiment of FIG. 1, the transistor 100 is shown coupled to the host circuit at its drain 4 and source 3. Similarly, the transistor 100 is shown coupled to the biasing circuit 30 at its source 3 and drain 4 and further at its gate 2. The transistor 100 behaves as a resistor in the triode region of its operation. Triode operation can be achieved in both strong and weak inversion regimes at low levels of drain-source voltage difference $V_{ds}$ 14. In this mode, $V_{ds}$ 14 can directly influence the drain-source current $I_{ds}$ 20 as in a resistor. An adjustable DC potential is provided to the biasing circuit 30 in the form of the variable voltage 34. That is, the variable voltage 34 is used as an adjustable DC potential to the biasing circuit 30.

In summary, in the embodiment of FIG. 1, the biasing circuit 30 couples the drain and source terminals of the MOS device 100 to the gate 2 terminal of the MOS device 100, and further couples a DC potential to the gate 2 terminal of the MOS device to adjust the resistance between the source 3 and drain 4 terminals of the MOS device, wherein the resistance between the source 3 and drain 4 terminals is a non-linear function of voltage potentials at the source ($V_s$ 15) and drain ($V_d$ 13) terminals. The biasing circuit 30 effectively reduces the non-linearity of the resistance between the drain 4 and source 3 terminals by modulating the potential at the gate 2 terminal of the MOS device by a combination of $V_s$ 15 and $V_d$ 13. The DC potential of the gate terminal is substantially determined by the DC potential coupled by the bias circuit, which is further used to adjust the resistance between the drain and source terminals of the MOS device. The AC potential of the gate 2 terminal of the MOS device is determined by a combination of the AC potential of the source 3 terminal of the MOS device and the AC potential of the drain 4 terminal of the MOS device.

By controlling the voltage at the gate 2 of the MOS device 1, the biasing circuit 30 effectively eliminates undesirable direct current (DC) offsets experienced by the transistor 100 acting as a resistor. MOS resistors are widely used in transcapacitance amplifiers in MEMS devices, where large resistor value is desirable due to lower noise. This technique prevents loss of dynamic range due to DC offsets that build-up in presence of alternating current (AC) signals. In FIG. 1, the $V_{ds}$ 14 includes AC signals.

In the strong inversion regime, drain current $I_{ds}$ 20 is related to terminal voltages as follows:

$$I_{ds} = \mu C_{ox} \frac{W}{L} \cdot \left(V_{gs} - V_{th} - \frac{V_{ds}}{2}\right) \cdot V_{ds}. \quad \text{Eq. (1)}$$

In the weak inversion regime, $I_{ds}$ 20 dependence on terminal voltages takes an exponential form $$I_{ds} = I_0 \cdot e^{\frac{V_{gs}}{nV_T}} \cdot \left(1 - e^{-\frac{V_{ds}}{V_T}}\right), \quad \text{Eq. (2)}$$

where $I_0$ is determined by the physical parameters of the device and is proportional to the transistor's width over length (W/L) ratio. The parameter n is determined by the ratio of gate oxide $C_{ox}$ to the capacitance $C_{dep}$ of the depletion under the gate.

$$n = 1 + \frac{C_{dep}}{C_{ox}}. \quad \text{Eq. (3)}$$

Parameter $V_T$ is the thermal voltage, which is determined by the absolute temperature T, Boltzman's constant $k_B$, and the electronic charge 'q' as follows:

$$V_T = \frac{k_B \cdot T}{q}. \quad \text{Eq. (4)}$$

At a given operating point, small-signal conductance of the MOS device between its drain and source $g_{ds}$ can be defined as the first order derivative of its drain current $I_{ds}$ with respect to the drain-source voltage difference $V_{ds}$.

$$g_{ds} = \frac{\partial I_{ds}}{\partial V_{ds}} \quad \text{Eq. (5)}$$

The resistance between its drain and source $r_{ds}$ is then equal to the inverse of the conductance $g_{ds}$.

$$r_{ds} = \frac{1}{g_{ds}} \quad \text{Eq. (6)}$$

The resistance in the strong inversion regime then becomes as follows:

$$r_{ds} = \frac{1}{\mu C_{ox} \frac{W}{L} \cdot (V_{gs} - V_{th} - V_{ds})} \quad \text{Eq. (7)}$$

while resistance in the weak inversion regime is $$r_{ds} = \frac{1}{\frac{I_0}{V_T} \cdot e^{\frac{V_{gs}}{nV_T}} \cdot e^{-\frac{V_{ds}}{V_T}}}. \quad \text{Eq. (8)}$$

In both regimes of operation the resistance is a strong function of the gate-to-source voltage difference $V_{gs}$ 11, shown in FIG. 1, which allows for a wide trim range associated with the MOS resistor. The resistance $r_{ds}$, however, also depends on the drain-to-source voltage $V_{ds}$ 14. However, such dependence undesirably introduces non-linearity into the resistance $r_{ds}$, which can cause intermodulation of signals applied between the terminals of the transistor 100 (or the MOS device).

Intermodulation effects can be modeled by introducing small-signal terms in equations governing MOS I-V characteristics. The quiescent voltage providing the bias point is denoted by a sub-script "0", while small-signal variations are represented by a small-case symbol. For example, the gate voltage $V_g$ 10 consists of the quiescent voltage $V_{g0}$ and the small-signal variation $v_g$:

$$V_g = V_{g0} + v_g \quad \text{Eq. (9)}$$

Following this notation, the small-signal current $i_{ds}$ flowing through the MOS resistor can be derived as follows for the strong inversion regime:

$$i_{ds} = I_{ds0} \cdot \left( \frac{v_{gs} - \frac{v_{ds}}{2}}{V_{gs0} - V_{th} - \frac{V_{ds0}}{2}} + \frac{v_{ds}}{V_{ds0}} \right) + \mu C_{ox} \frac{W}{L} \cdot \left( v_{gs} - \frac{v_{ds}}{2} \right) \cdot v_{ds}. \quad \text{Eq. (10)}$$

Where $I_{ds0}$ is the quiescent current flowing through the MOS resistor. For a wide variety of biasing applications, where the PMOS device is used merely for providing a DC bias voltage, and $I_{ds0}$ is expected to be 0. For example, one common use of the MOS resistor is to provide DC bias voltage for the input of a CMOS operational amplifier, where there is no quiescent current flowing through the MOS resistor.

The first term in the $i_{ds}$ equation, Eq. (10), is simply the small-signal variation of the current in response to voltage changes and directly related to the transconductances $g_m$ and $g_{ds}$. The second term in Eq. (10), however, arises from the non-linear operation and causes intermodulation of small-signal terms $v_{ds}$ and $v_{gs}$. Even if small-signal terms $v_{gs}$ and $v_{ds}$ are pure AC signals, intermodulation can produce a small-signal DC current through the MOS resistor. The accompanying circuit, which in the embodiment of FIG. 1 is the host circuit, then builds a DC offset across the MOS resistor until the DC current is balanced by the DC offset. This DC offset emerges only in the presence of AC signals applied to the MOS resistor. Even if a DC offset may not directly interfere with the AC signal, it reduces the dynamic range of the host circuit.

The intermodulation-producing term in $i_{ds}$, Eq. (10, can be nulled or cancelled if $v_{gs}$ and $v_{ds}$ meet the following condition:

$$v_{gs} = \frac{v_{ds}}{2} \qquad \text{Eq. (11)}$$

which implies that:

$$v_g = \frac{v_d}{2} + \frac{v_s}{2} \qquad \text{Eq. (12)}$$

This condition can be achieved by help of the biasing circuit 30, in FIG. 1, around the MOS resistor, where the DC potential of $V_g$ ($V_{g0}$) is set based on the desired resistance while the small-signal AC variation $v_g$ strictly follows the condition above, in Eq. (12). This biasing circuit 30 would accordingly simplify $i_{ds}$ into the following:

$$i_{ds} = I_{ds0} \cdot \frac{v_{ds}}{V_{ds0}}, \qquad \text{Eq. (13)}$$

which is equivalent to the following:

$$i_{ds} = \frac{v_{ds}}{r_{ds}} \qquad \text{Eq. (14)}$$

An analysis similar to that which is done for the strong inversion resistor regime can also be done for the weak inversion regime of operation, as follows:

$$I_{ds} = \frac{I_{ds0}}{1 - e^{\frac{V_{ds0}}{V_T}}} \cdot e^{\frac{v_{gs}}{nV_T}} \cdot \left(1 - e^{-\left(\frac{V_{ds0}}{V_T} + \frac{v_{ds}}{V_T}\right)}\right). \qquad \text{Eq. (15)}$$

However, it is more challenging to separate the small signal current $i_{ds}$ in this case, but by using the Taylor series expansion for the exponential term, as follows:

$$e^x = \sum_{n=0}^{\infty} \frac{x^n}{n!}. \qquad \text{Eq. (16)}$$

it can be shown that each exponential term produces many intermodulation products, which can yield a DC current.

Figure 3A:
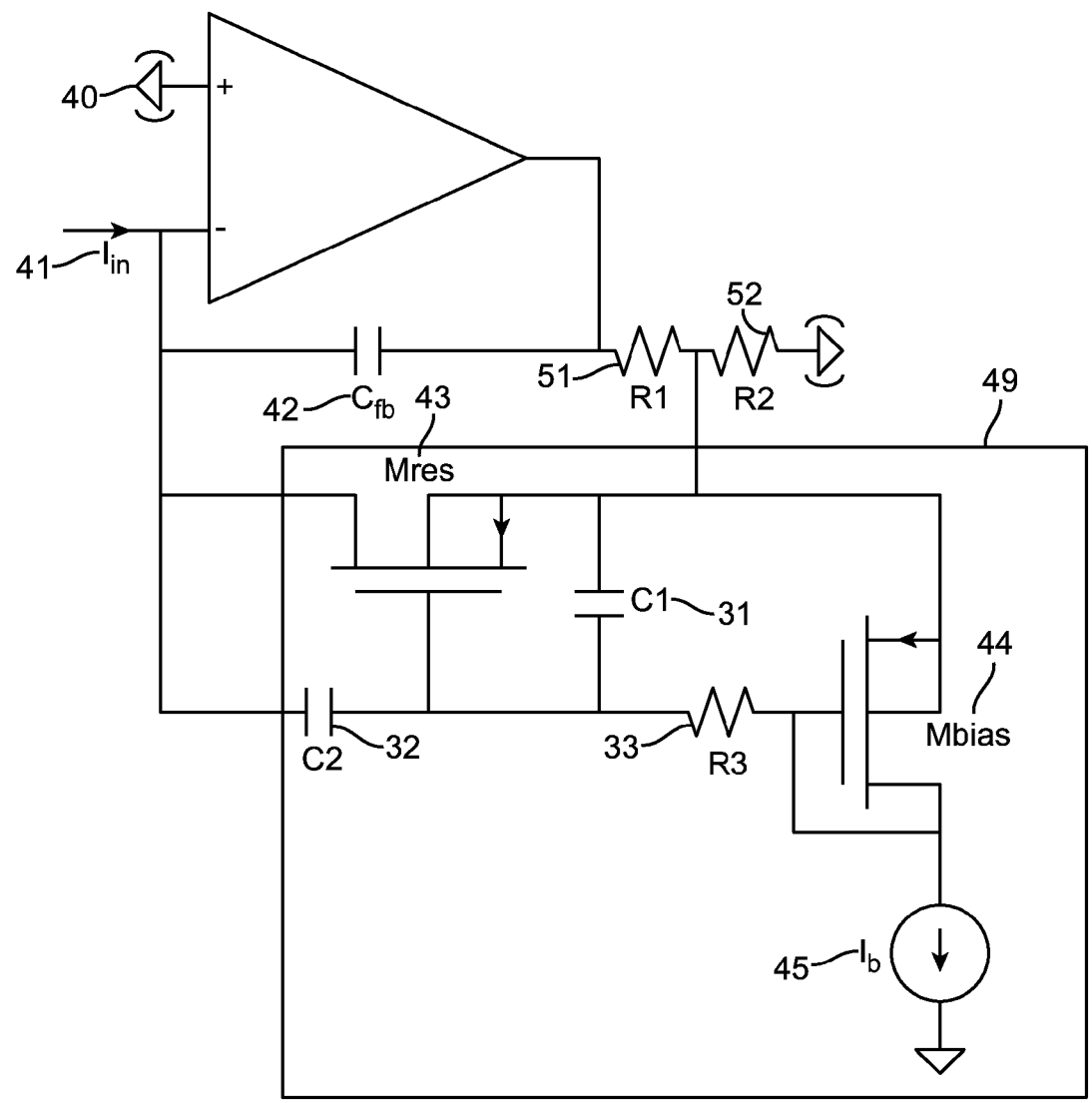
FIG. 3a shows a single-ended trans-capacitance amplifier employing a MOS resistor in its feedback, in accordance with an embodiment of the invention.

In a more specific application, where the weak inversion MOS resistor is strictly used for providing a bias voltage, i.e. trans-capacitance amplifier of FIG. 3a, quiescent potential difference between drain and source $V_{ds0}$ becomes 0. Thus, the small-signal drain current $i_{ds}$ can be simplified and expressed as the following relationship:

$$i_{ds} = I_0 \cdot e^{\frac{V_{gs0}}{nV_T}} \cdot e^{\frac{v_{gs}}{nV_T}} \cdot \left(1 - e^{-\frac{v_{ds}}{V_T}}\right) \qquad \text{Eq. (17)}$$

It can be mathematically shown that $i_{ds}$ will have only odd powers of intermodulation terms, which do not produce a DC offset, if the following condition is met:

$$\frac{v_{gs}}{n} = \frac{v_{ds}}{2} \qquad \text{Eq. (18)}$$

The condition of Eq. (18) requires the following condition to be met:

$$v_g = \frac{n}{2} v_d + \frac{2-n}{2} v_s \qquad \text{Eq. (19)}$$

Similar to the strong inversion case, this condition can be achieved by help of the biasing circuit 30, in FIG. 1, around the MOS resistor, where the DC potential of $V_g$ ($V_{g0}$) is set based on the desired resistance while the small-signal AC variation $v_g$ strictly follows the condition above, in Eq. (19).

Under the abovementioned condition MOS resistor current is further simplified into the following:

$$i_{ds} = I_0 \cdot e^{\frac{V_{gs0}}{nV_T}} \cdot \left(e^{\frac{v_{ds}}{2V_T}} - e^{-\frac{v_{ds}}{2V_T}}\right) \qquad \text{Eq. (20)}$$

The Taylor series expansion of $i_{ds}$ becomes:

$$i_{ds} = I_0 \cdot e^{\frac{V_{gs0}}{nV_T}} \cdot 2 \cdot \left(\left(\frac{v_{ds}}{2V_T}\right) + \frac{1}{3!}\left(\frac{v_{ds}}{2V_T}\right)^3 + \ldots\right), \qquad \text{Eq. (21)}$$

where there are only odd powers of small-signal drain to source voltage difference $v_{ds}$. The intermodulation can no longer produce small-signal DC currents, hence, the presence of an AC signal does not lead to a DC offset.

It is understood that FIG. 1 presents a conceptual diagram of the PMOS device 1. More specific circuits for practical realization of the embodiment of FIG. 1 are depicted in FIGS. 2a to 2d and described below.

Figure 2A:
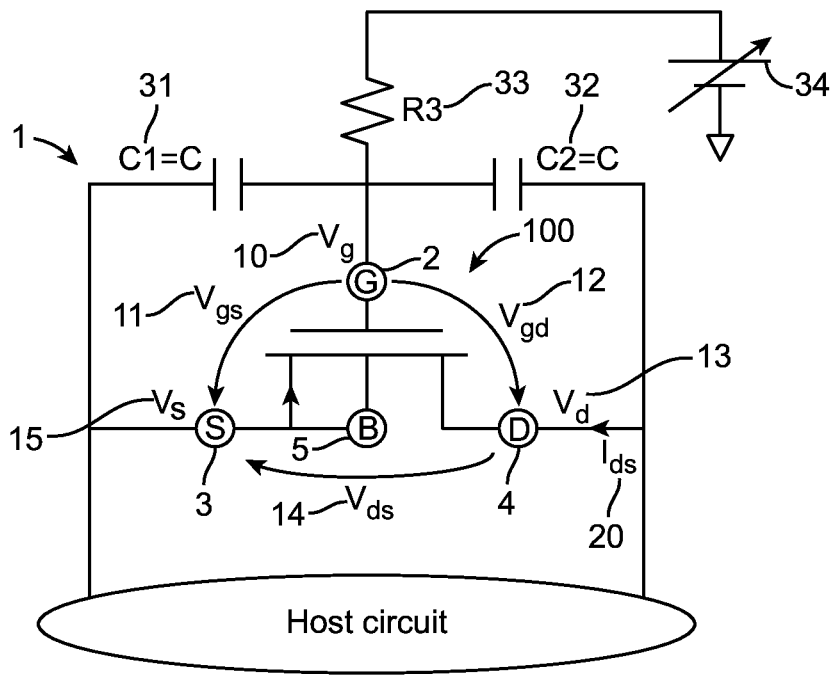
FIG. 2a shows a PMOS device, used as a MOS resistor and biased in strong inversion, in accordance with another embodiment of the invention.

FIG. 2a shows a PMOS device, used as a MOS resistor and biased in strong inversion, in accordance with another embodiment of the invention. In FIG. 2a, the biasing circuit 30 is effectively comprised of the capacitor C1, or capacitor 31, the capacitor C2, or capacitor 32, and the resistor R3, the resistor 33. The capacitors 31 and 32, and the resistor 33 collectively form a resistor-capacitor (RC) biasing network. As shown in FIG. 2a, the capacitor 31 is coupled between the source 3 and the gate 2 and the capacitor 32 is coupled between the drain 4 and the gate 2. Capacitors 31 and 32 are of substantially equal capacitance in order to implement the condition explained by Eq. 12. The resistor 33 is shown coupled between the gate 2 and the variable voltage 34.

The network of the capacitor 31, the capacitor 32, and the resistor 33 forms a high-pass filter from drain 4 and source 3 nodes to the gate 2, while the resistor 33 provides the quiescent potential to set the MOS resistance.

The RC biasing network of FIG. 2a helps to avoid DC-producing intermodulation in MOS resistor biased in strong inversion.

Figure 2B:
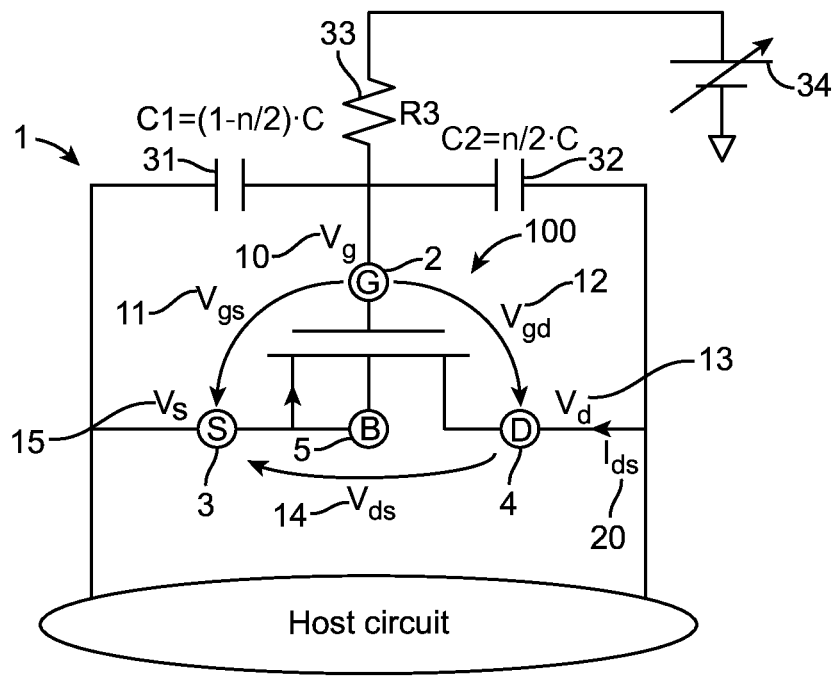
FIG. 2b shows a PMOS device, used as a MOS resistor and biased in weak inversion, in accordance with yet another embodiment of the invention.

FIG. 2b shows a PMOS device, used as a MOS resistor and biased in weak inversion, in accordance with yet another embodiment of the invention. The embodiment of FIG. 2b is analogous to that of FIG. 2a except that the capacitors 31 and 32 are not of substantially equal capacitance, rather, the capacitance of the capacitor 31 is $(1-n/2)*C$ and the capacitance of the capacitor 33 is $(n/2)*C$. n is substantially determined by a ratio of gate oxide capacitance to the depletion capacitance under the channel of the MOS device, and is a known characteristic of a MOS transistor. The capacitance C is substantially determined by the frequency range where the AC signals are expected.

Embodiments of the MOS resistor, shown in FIG. 1 through FIG. 2b, show a MOS resistor whose bulk terminal, bulk 5, is coupled to the source of the MOS resistor, or source 3 and to the drain of the MOS resistor, or drain 4. This particular configuration has the advantage of avoiding leakage currents from the drain 4 to the bulk 5.

Figure 2C:
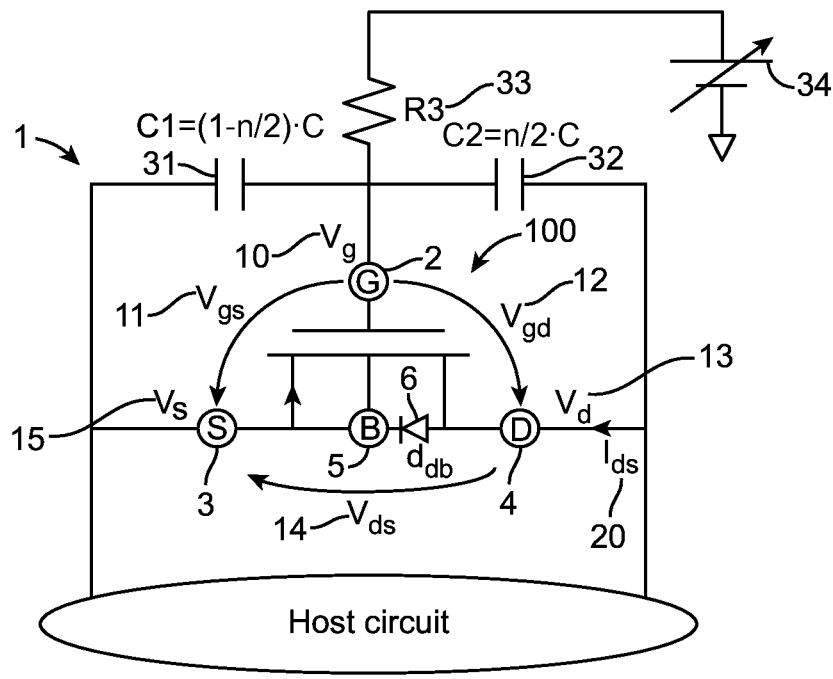
FIG. 2c shows a PMOS device, used as a MOS resistor and biased in weak inversion, and an inherent drain-to-bulk diode, in accordance with another embodiment of the invention.

FIG. 2c shows a PMOS device, used as a MOS resistor and biased as a strong inversion resistor, in accordance with another embodiment of the invention. The embodiment of FIG. 2c is analogous to that of FIG. 2b except that in FIG. 2c, an inherent drain-to-bulk diode 6 coupled between the drain 4 and the bulk 5 is explicitly shown. The diode 6 is inherent to the MOS device of FIG. 2c and not necessarily a diode device that is added to the MOS device.

As shown in another embodiment, such as depicted in FIG. 2c, the MOS device can further include an inherent drain-to-bulk diode, $d_{db}$ 6. The diode $d_{db}$ 6 introduces small-signal terms that can result in DC offsets.

The embodiment of FIG. 2c meets the condition of Eq. (19), hence, the MOS resistor is biased in weak inversion.

The following equation shows the total drain-to-source current of a MOS resistor biased in weak inversion, while utilizing the biasing circuit, and the impact of the drain-to-bulk diode $d_{db}$ 6.

$$i_{ds} = I_0 \cdot e^{\frac{V_{gs0}}{nV_T}} \cdot 2 \cdot \left( \left(\frac{v_{ds}}{2V_T}\right) + \frac{1}{3!}\left(\frac{v_{ds}}{2V_T}\right)^3 + \ldots \right) + \qquad \text{Eq. (22)}$$

$$I_{d0} \cdot \left( 1 + \left(\frac{v_{ds}}{V_T}\right) + \frac{1}{2!}\left(\frac{v_{ds}}{V_T}\right)^2 + \ldots \right)$$

The biasing circuit, i.e. the capacitors 31 and 32 and the resistor 33, is effective to prevent DC offsets caused by the operation of the MOS resistor. As long as the resistance of the MOS device is much smaller than the small-signal resistance of the diode $d_{db}$ 6, the diode $d_{db}$ 6 related terms are negligible. Furthermore, small-signal impedance of the drain-to-bulk diode $d_{db}$ 6 eventually limits the maximum resistance achieved by adjusting the gate potential of the MOS resistor.

Figure 2D:
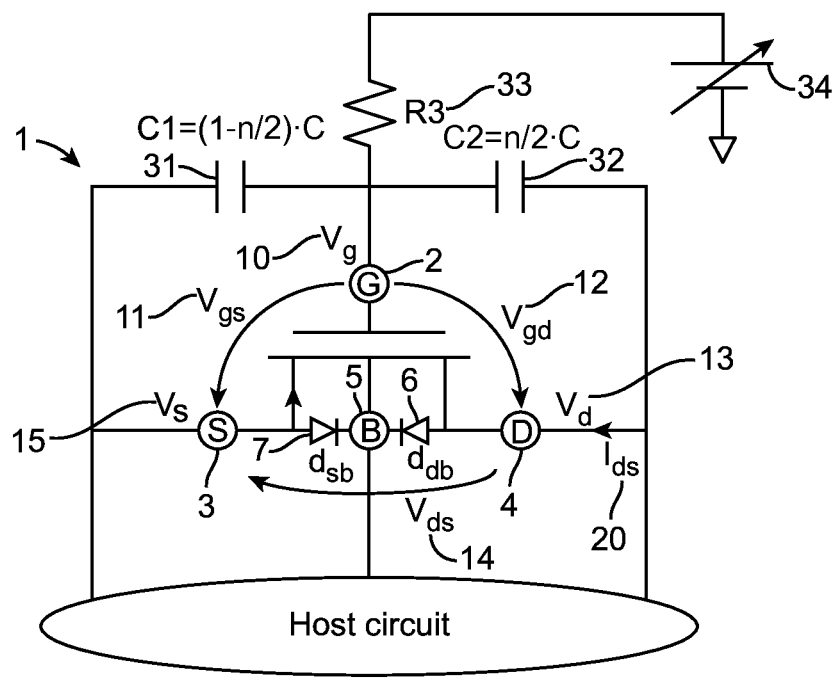
FIG. 2d shows a PMOS device, used as a MOS resistor and biased in weak inversion, and inherent drain-to-bulk and source-to-bulk diodes, in accordance with another embodiment of the invention.

FIG. 2d shows a PMOS device, used as a MOS resistor biased in weak inversion and inherent drain-to-bulk and source-to-bulk diodes, in accordance with another embodiment of the invention. In FIG. 2d, the PMOS transistor is biased with an RC network, and a separate potential for biasing the bulk terminal. In the embodiment of FIG. 2d, the bulk 5 node is shown coupled to the diodes $d_{sb}$ 7, which is shown coupled to the source 3, and to the diode $d_{db}$ 6, which is shown coupled to the drain 4, otherwise, the embodiment of FIG. 2d is analogous to that of FIG. 2c. In effect, in FIG. 2d, the bulk 5 node is coupled to a separate node entirely to prevent drain-to-bulk diode $d_{db}$ 6 from being in-parallel with the MOS resistor. In this implementation, however, both the source 3 and the drain 4 nodes are still limited by the diode, $d_{db}$ 6, in terms of maximum impedance that can be achieved. Furthermore, the bulk 5 node should be carefully biased at substantially the same potential as the source 3 and the drain 4 nodes to avoid leakage currents which can cause significant offsets.

A limitation in the operation of the MOS resistor is to maintain small-signal AC levels at the gate 2, the source 3, and the drain 4 terminals of the MOS resistor to maintain accuracy of the conditions discussed above relative to the equations. In weak inversion regime, for example, the level of AC signals can be at or lower than the thermal voltage $V_T$, which is approximately 25.6 mV at room temperature.

FIG. 3a shows a single-ended trans-capacitance amplifier employing a MOS resistor in its feedback path to provide a DC biasing voltage at its input, in accordance with an embodiment of the invention. The single-ended trans-capacitance amplifier 40 is shown coupled to the MOS resistor and the bias circuit 49. The MOS resistor and the biasing circuit 49 is shown to include the transistor 43, which behaves like a resistor and is also referred to herein as "Mres 43", the capacitor C1 31, the capacitor C2 32, the resistor R3 33, the transistor 44, and the current source 45. The transistor 43 is shown coupled to the input 41 of the amplifier 40, as is one end of the capacitor C2 32. The transistor 43 is further shown to be coupled to the capacitor C2 32 at its gate. The capacitor C1 31 is shown coupled to the source of Mres 43 and, at an opposite end, to the gate of Mres 43. The gate of the transistor 43 is also coupled to the resistor R3 33. The resistor R3 33 is shown coupled, at an opposite end, to the current source 45 and to the transistor 44, which is also referred to herein as "Mbias 44" because it serves in the biasing circuit and is further coupled to the current source 45 also referred to herein as "$I_b$"). Additionally, the Mbias 44 is coupled to the resistors R1 51 and R2 52 and the capacitor C1 31 at a common node. The gate of Mbias 44 and its drain are coupled to the current source 45 at a node that is coupled to the resistor R3 33. The resistor R1 51 is shown coupled to the resistor R2 52, which is coupled to a virtual ground at an end that is not coupled to the resistor R1 51. Both resistors R1 51 and R2 52 are also shown coupled to the MOS resistor 43. An input of the amplifier 40 that is not the input 61 is shown coupled to a virtual ground.

Trans-capacitance amplifiers, such as the trans-capacitance amplifier 40, are often used in sensing applications, where an input current, i.e. $I_{in}$ at the input 41 provided to the amplifier 40, is converted into a voltage output through the feedback capacitor $C_{fb}$ 42. FIG. 3a shows one embodiment of a continuous-time single-ended trans-capacitance amplifier. The DC operating point of the input 41 of the amplifier 40 is established by the Mres 44, which is a MOS biasing resistor, providing a DC path from the amplifier's negative input to its output. In order to protect the MOS biasing resistor from large voltage swings at the output, a voltage divider network made of the resistors R1 51 and R2 52 is also used as part of the DC path. The noise contribution of this MOS resistor $V_{nR}$ at the output of the amplifier 40 is determined by its resistance $R_{MOS}$, as follows:

$$v_{nR} = \sqrt{4k_B T \frac{1}{R_{MOS}} \cdot \frac{\frac{R_{1+R_2}}{R_2}}{\frac{1}{R_{MOS}} + 2\pi f c_{fb} \cdot \frac{R_{1+R_2}}{R_2}}} \quad \text{Eq. (23)}$$

It is often critical in sensing applications to minimize the noise contribution from the MOS resistor 43 by using a very large resistance value. Large feedback resistor can also be desirable in order to lower the frequency where the feedback capacitor becomes effective.

In the embodiment of FIG. 3a, the MOS resistor, Mres 43, is shown with the biasing circuit of the capacitors C1 31 and C2 32, and the resistor R3 33. DC potential at the gate of the MOS resistor is provided by a bias current $I_b$ 45 and a biasing transistor Mbias 44. It is possible to achieve a large resistance on the order of giga-ohms by reducing the bias current as well as using a large width-to-length (W/L) ratio difference between the MOS resistor Mres 43 and its biasing device Mbias 44. The MOS resistor Mres 43 needs to be much longer than the biasing device Mbias 44 in order to achieve large resistance values. Assuming zero DC value for $V_{ds}$, small-signal resistance $r_{ds}$ of the Mres 43 is as follows:

$$r_{ds} = \frac{V_T}{I_b} \cdot \frac{\left(\frac{W}{L}\right)_{Mbias}}{\left(\frac{W}{L}\right)_{Mres}} \quad \text{Eq. (24)}$$

The MOS resistor, Mres 43, in the embodiment of FIG. 3a is subject to AC signals due to the sensing application. Unless the circuit technique proposed earlier is used, such voltage variations create a DC offset at the output of the trans-capacitance amplifier 40. Furthermore, a large MOS resistance results in very long time constants, which causes the DC offset to form over a prolonged time. In the embodiment in FIG. 3a, the RC network of the capacitors C1 31 and C2 32 and the resistor R3 33, being coupled to the appropriate terminals, create the zero DC offset condition. In cases where the Mbias 44 itself provides a large enough impedance, the biasing resistor R3 33 can be omitted.

Figure 3B:
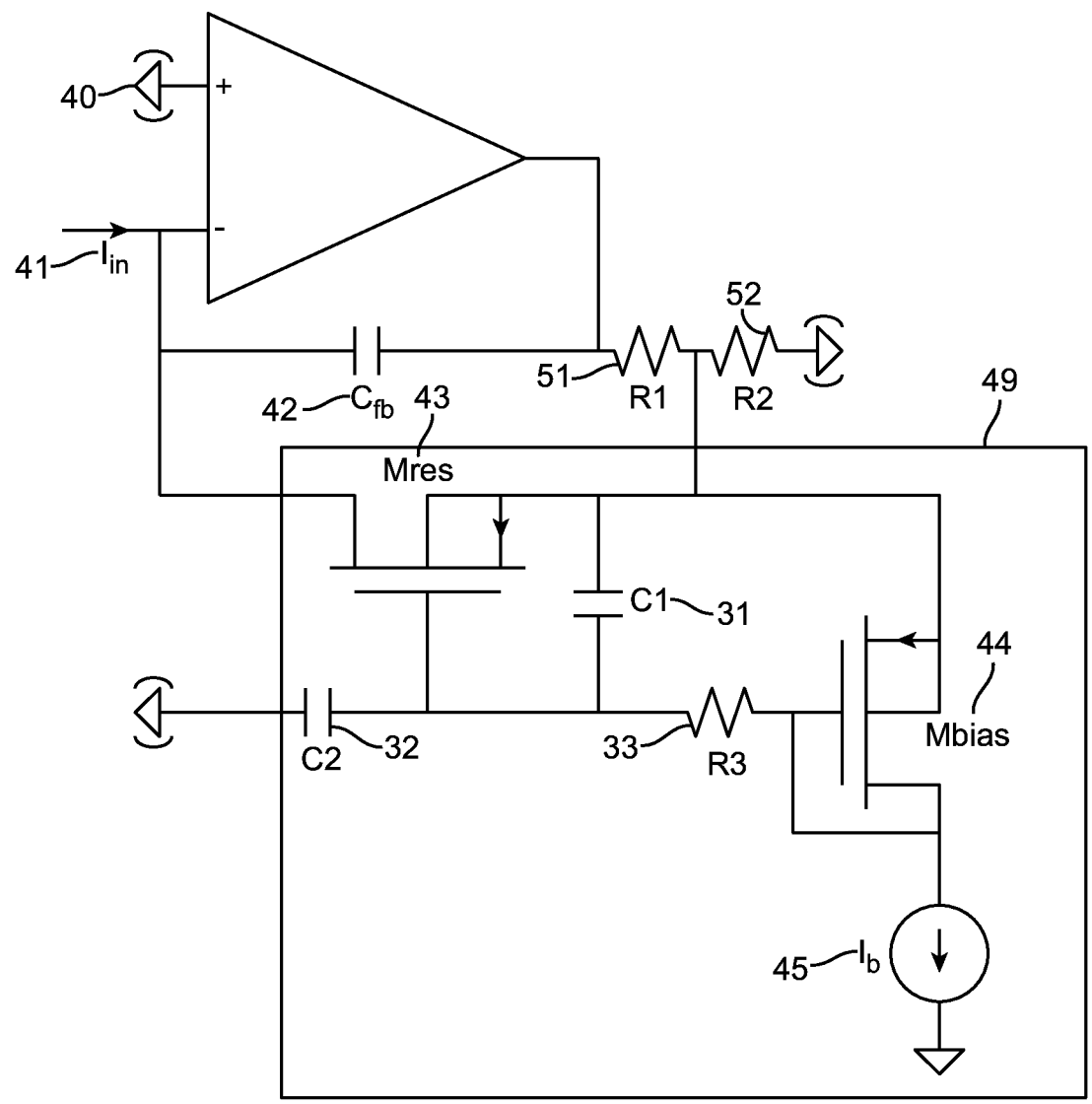
FIG. 3b shows a single-ended trans-capacitance amplifier employing a MOS resistor in its feedback, in accordance with another embodiment of the invention.

FIG. 3b shows a single-ended trans-capacitance amplifier employing a MOS resistor in its feedback, in accordance with another embodiment of the invention. The input node of the trans-capacitance amplifier can be protected from additional loading of capacitance of C2 31, by connecting the capacitor C2 31 to ground instead. Since the input node 71 of the amplifier 40 is already at virtual ground and does not carry any significant signal, this configuration can still prevent undesirable DC offsets resulting from the intermodulation.

Figure 4A:
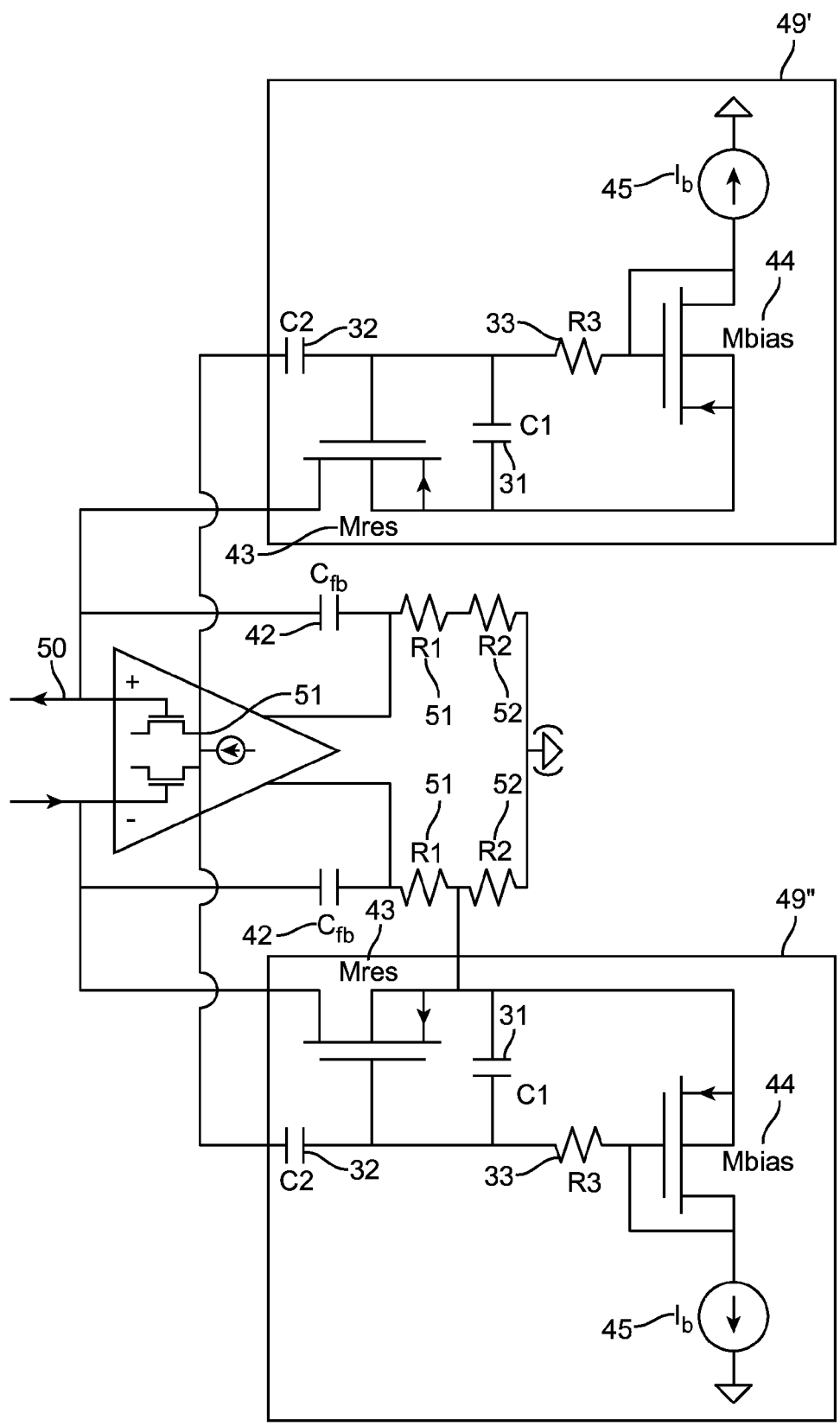
FIG. 4a shows a differential trans-capacitor amplifier employing MOS resistors in its feedback and further employing output common mode feedback, in accordance with another embodiment of the invention.

FIG. 4a shows a differential trans-capacitor amplifier employing MOS resistors in its feedback and further employing output common mode in its feedback, in accordance with another embodiment of the invention. In the embodiment in FIG. 4a, the differential trans-capacitance amplifier 50 is shown to be coupled to two MOS resistors, MOS resistor and biasing circuit 49', and MOS resistor and biasing circuit 49", both of which are coupled to the feedback path of the amplifier 50. Each of the MOS resistors and biasing circuit 49' and 49" is analogous to the MOS resistor and biasing circuit 49 of FIG. 3a except that in FIG. 4a, each one is coupled to a distinct input and output of the amplifier 50. Further coupled to the two outputs of the amplifier 50 is a pair of resistors, resistors R1 51 and R2 52, which are shown coupled together and further each of the resistors R1 51 is shown coupled to a feedback capacitor $C_{fb}$ 42. Each of the capacitors C2 32 is shown coupled to the amplifier 50.

The MOS resistors serve as biasing resistors providing DC bias for the input nodes of the amplifier. In cases where the output common-mode feedback is preferred input common-mode can have significant AC signals due to, for example, input signal mismatch. Thus, biasing resistors will be subject to AC signals on both source and drain terminals. Since, the signal at the source terminals of the input differential pair predominantly consists of input common-mode variations, source terminal of the input pair (51) in the op-amp can be used to drive C2 (35) of the biasing circuit. Even though, the source of the input pair (46) is not at the same DC potential as the drain of the MOS resistor Mres (44), it follows AC common-mode variations at the input. This configuration also has the advantage of preventing additional capacitive loading at the amplifier input.

If input common-mode feedback is used, input nodes behave as virtual ground and there is no significant AC signal at the drain terminal of the MOS resistor. Thus, C2 (31) can be connected to the ground and can still prevent undesired DC offsets due to intermodulation. Connecting C2 (31) to the input nodes would still be sufficient for the scheme to work, but would add parasitics to the input of the transcapacitance amplifier.

Figure 4B:
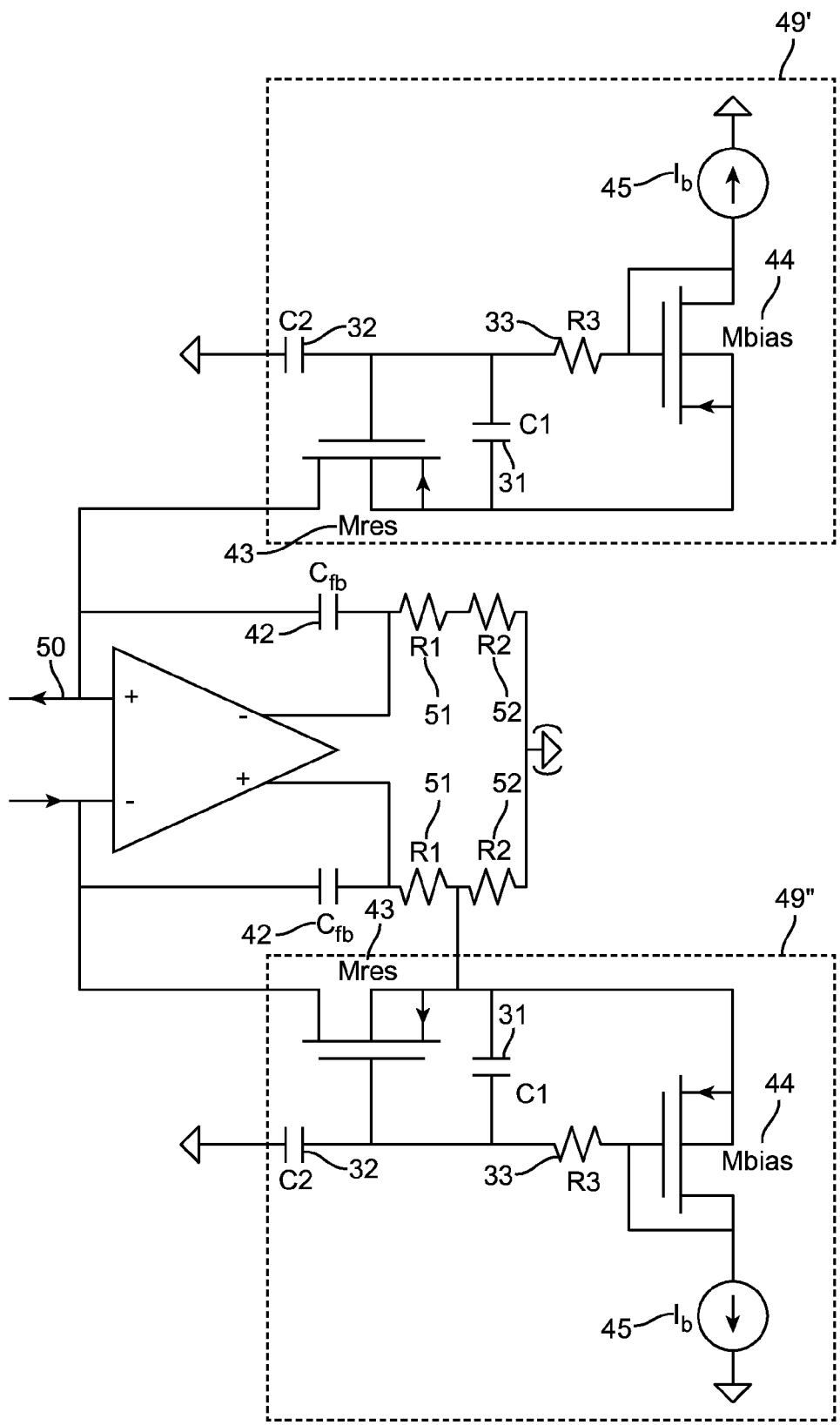
FIG. 4b shows a differential trans-capacitor amplifier employing MOS resistors in its feedback and further employing input common mode feedback, in accordance with another embodiment of the invention.

FIG. 4b shows a differential trans-capacitor amplifier employing MOS resistors in its feedback and further employing input common mode in its feedback, in accordance with another embodiment of the invention. The embodiment of FIG. 4b is analogous to that of FIG. 4a except that the capacitors C2 32 of the embodiment of FIG. 4b are each coupled to ground rather than the amplifier 50, as in the case of the embodiment of FIG. 4a.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A circuit operable to use a MOS device in a triode mode of operation comprising,
   a biasing circuit; and
   a MOS device having a drain terminal, a source terminal, and a gate terminal, and being coupled to the biasing circuit, the source terminal having associated therewith a potential, the drain terminal having associated therewith a potential, and the gate terminal having associated therewith a potential, the drain and the source terminals having associated there between a resistance, wherein the biasing circuit couples the drain and source terminals of the MOS device to the gate terminal of the MOS device, and further wherein the biasing circuit couples a DC potential to the gate terminal of the MOS device to adjust the resistance between the source and drain terminals of the MOS device, wherein the resistance between the source and drain terminals is a non-linear function of voltage potentials at the source and drain terminals, the biasing circuit being operable to reduce the non-linearity of the resistance between the drain and source terminals by modulating the potential at the gate terminal of the MOS device by a combination of source and drain terminal potentials.

2. The circuit of claim 1, wherein the source, drain, and gate terminals of the MOS device each have an AC potential associated therewith and the biasing circuit further comprising:
 a first capacitor coupled between the gate terminal of the MOS device and the source terminal of the MOS device;
 a second capacitor coupled between the gate terminal of the MOS device and the drain terminal of the MOS device; and
 a resistor coupled between the gate terminal of the MOS device and a DC potential,
 wherein the DC potential of the gate terminal is determined by the DC potential coupled by the resistor and is used to adjust the resistance between the drain and source terminals of the MOS device,
 further wherein the AC potential of the gate terminal of the MOS device is determined by a combination of the AC potential of the source terminal of the MOS device and the AC potential of the drain terminal of the MOS device.

3. The circuit of claim 2, wherein the MOS device operates in the strong inversion regime,
 the first capacitor has a capacitance that is substantially equal to a capacitance of the second capacitor to reduce intermodulation between AC potentials of source and drain terminals of the MOS device,
 the reduction of intermodulation between the source and the drain terminals of the MOS device further reduces generation of undesired DC currents between drain and source terminals of the MOS device.

4. The circuit of claim 2, wherein;
 the MOS device operates in the weak inversion regime,
 the first capacitor has a capacitance associated therewith and the second capacitor has a capacitance associated therewith and a ratio of the first capacitor to the second capacitor is substantially determined by a ratio of gate oxide capacitance to the depletion capacitance under the channel of the MOS device to reduce intermodulation between AC potentials of source and drain terminals of the MOS device,
 the reduction of the intermodulation between the source and drain terminals of the MOS device further reduces generation of undesired DC currents between the drain and source terminals of the MOS device.

5. The circuit of claim 2, wherein;
 the value of the resistor is high enough to allow capacitors of the biasing circuit to substantially determine the AC potential at the gate of the MOS device.

6. The circuit of claim 2, wherein the MOS device further has a bulk terminal and the bulk terminal of the MOS device is coupled to the source terminal of the MOS device, further wherein an inherent diode device is between the drain and the bulk terminals thereby creating additional intermodulation between the source and the drain terminals of the MOS device.

7. The circuit of claim 2, wherein;
 the bulk terminal of the MOS device is individually coupled to another DC potential,
 the individual connection of the bulk terminal substantially prevents intermodulation between source and drain terminals of the MOS device due to the inherent source-to-bulk and drain-to-bulk diodes,
 the DC potential of the bulk terminal is substantially similar to the DC potential of the drain and source terminals to prevent leakage currents.

8. A single-ended trans-capacitance amplifier having an input node comprising:
 an MOS device being operable to provide a DC path to the input node, the MOS device having a drain terminal, a source terminal, and a gate terminal, the source terminal and the drain terminal having a resistance there between, the source terminal have a voltage potential associate therewith and the drain terminal having a potential associated therewith and the gate terminal having a voltage potential associated therewith;
 a biasing circuit being operable to couple drain and source terminals to the gate terminal of the MOS device, the biasing circuit further couples a DC potential to the gate terminal of the MOS device,
 wherein the DC potential is operable to adjust the resistance between the source and the drain terminals, the resistance between the source and the drain terminals being a non-linear function of the voltage potentials of the source and drain terminals,
 the biasing circuit being operable to reduce the non-linearity of the resistance between the drain and the source terminals by modulating the voltage potential of the gate terminal by a combination of the source and the drain voltage terminal potentials.

9. The single-ended trans-capacitance amplifier of claim 8, wherein the source, drain, and gate terminals of the MOS device each have an AC potential associated therewith and the biasing circuit further comprising:
 a first capacitor coupled between the gate terminal of the MOS device and the source terminal of the MOS device;
 a second capacitor coupled between the gate terminal of the MOS device and the drain terminal of the MOS device; and
 a resistor coupled between the gate terminal of the MOS device and a DC potential,
 wherein the DC potential of the gate terminal is determined by the DC potential coupled by the resistor and is used to adjust the resistance between the drain and source terminals of the MOS device.

10. The single-ended trans-capacitance amplifier of claim 8, wherein the MOS device operates in the strong inversion regime,
 the first capacitor has a capacitance that is substantially equal to a capacitance of the second capacitor to reduce intermodulation between AC potentials of source and drain terminals of the MOS device,
 the reduction of intermodulation between the source and the drain terminals of the MOS device further reduces generation of undesired DC currents between drain and source terminals of the MOS device.

11. The single-ended trans-capacitance amplifier of claim 8, wherein;
 the MOS device operates in the weak inversion regime and has a channel,
 the first capacitor has a capacitance associated therewith and the second capacitor has a capacitance associated therewith and a ratio of the first capacitor to the second capacitor is substantially determined by a ratio of gate oxide capacitance to the depletion capacitance under the channel of the MOS device to reduce intermodulation between AC potentials of source and drain terminals of the MOS device,
 the reduction of the intermodulation between the source and drain terminals of the MOS device further reduces generation of undesired DC currents between the drain and source terminals of the MOS device.

12. The single-ended trans-capacitance amplifier of claim 8, wherein;
the value of the resistor is high enough to allow capacitors of the biasing circuit substantially determine the AC potential at the gate of the MOS device.

13. The single-ended trans-capacitance amplifier of claim 8, wherein;
the drain terminal of the MOS device is coupled to the input node of the trans-capacitance of the amplifier,
the input of the trans-capacitance amplifier is substantially an AC ground,
the second capacitor couples the gate of the MOS device to an AC ground instead of the drain terminal of the MOS device.

14. A differential trans-capacitance amplifier having a positive input and a negative input comprising:
a first biasing circuit;
a second biasing circuit;
a first MOS device operable to provide a first DC path to the positive input of the trans-capacitance amplifier, the first MOS device having a drain terminal, a source terminal and a gate terminal, the source and drain terminals of the first MOS device having a resistance associated there between;
a second MOS device operable to provide a second DC path to the negative input of the trans-capacitance amplifier, the second MOS device having a drain terminal, a source terminal and a gate terminal, the source and drain terminals of the second MOS device having a resistance associated there between;
the drain and source terminals of the first MOS device being coupled to the gate terminal of the first MOS device by the first biasing circuits and the drain and source terminals of the second MOS device being coupled to the gate terminal of the second MOS device by the second biasing circuits, the first biasing circuit operable to couple a first DC potential to the gate terminal of the first MOS devices, the second biasing circuit operable to couple a second DC potential to the gate terminal of the second MOS device, the source and drain terminals of the second MOS device having associated therewith a resistance,
the first DC potential being operable to adjust the resistance between source and drain terminals of the first MOS device,
the second DC potential being operable to adjust the resistance between source and drain terminals of the second MOS device,
the first biasing circuit being operable to reduce a first non-linearity of the resistance between drain and source terminals of the first MOS device by modulating a potential at the gate terminal of the first MOS device by a combination of a potential at the source terminal of the first MOS device and a potential at the drain terminal of the first MOS device,
the second biasing circuit being operable to reduce a second non-linearity of the resistance between drain and source terminals of the second MOS device by modulating the potential at the gate terminal of the second MOS device by a combination of the potential at the source terminal of the second MOS device and the potential at the drain terminal of the second MOS device.

15. The differential trans-capacitance amplifier of claim 14 wherein,
the first biasing circuit further comprising a first capacitor, a second capacitor, and a resistor,
the second biasing circuit further comprising a first capacitor, a second capacitor, and a resistor,
the gate terminal of the first MOS device being coupled to the source terminal of the first MOS device by the first capacitor of the first biasing circuit,
the gate terminal of the second MOS device being coupled to the source terminal of the second MOS device by the first capacitor of the second biasing circuit,
the gate terminal of the first MOS device being coupled to the drain terminal of the first MOS device by the second capacitor of the first biasing circuit,
the gate terminal of the second MOS device being coupled to the drain terminal of the second MOS by the second capacitor of the second biasing circuit,
the gate terminal of the first MOS device being coupled to a first DC potential by the first resistor of the first biasing circuit,
the gate terminal of the second MOS device being coupled to a second DC potential by the first resistor of the second biasing circuit,
the DC potential of the gate terminal of the first MOS device being operable to adjust the resistance between the drain and source terminals of the first MOS device,
the DC potential of the gate terminal of the second MOS device being operable to adjust the resistance between the drain and source terminals of the second MOS device,
the AC potential of the gate terminal of the first MOS device being determined by a combination of AC potentials at the source and the drain terminals of the first MOS device,
the AC potential of the gate terminal of the second MOS device is determined by a combination of AC potentials at the source and the drain terminals of the second MOS device.

16. The differential trans-capacitance amplifier of claim 14 wherein,
the first MOS device is operable in the strong inversion regime,
the second MOS device is operable in the strong inversion regime,
the value of the first capacitor of the first biasing circuit is substantially equal to the second capacitor of the first biasing circuit to reduce intermodulation between AC potentials of source and drain terminals of the first MOS device,
the value of the first capacitor of the second biasing circuit is substantially equal to the second capacitor of the second biasing circuit to reduce intermodulation between AC potentials of source and drain terminals of the second MOS device,
the reduction of intermodulation between source and drain terminals of the first MOS device further reduces generation of undesired DC currents between drain and source terminals of the first MOS device,
the reduction of intermodulation between source and drain terminals of the second MOS device further reduces generation of undesired DC currents between drain and source terminals of the second MOS device.

17. The differential trans-capacitance amplifier of claim 14 wherein,
the first MOS device is operable in the weak inversion regime, the second MOS device is operable in the weak inversion regime, the ratio of the first capacitor of the first biasing circuit to the second capacitor of the first biasing circuit is substantially determined by the ratio of gate oxide capacitance to the depletion capacitance under the channel of the first MOS device to reduce intermodulation between AC potentials of source and drain terminals of first MOS device, the ratio of the first capacitor of the second biasing circuit to the second capacitor of the second biasing circuit is substantially determined by the ratio of gate oxide capacitance to the depletion capacitance under the channel of the second MOS device to reduce intermodulation between AC potentials of source and drain terminals of second MOS device, the reduction of intermodulation between source and drain terminals of the first MOS device further reduces generation of undesired DC currents between drain and source terminals of the first MOS device, the reduction of intermodulation between source and drain terminals of the second MOS device further reduces generation of undesired DC currents between drain and source terminals of the second MOS device.

18. The differential trans-capacitance amplifier of claim 14 wherein, the value of the resistor of the first biasing circuit is high enough to allow capacitors of the biasing circuit substantially determine the AC potential at the gate terminal of the first MOS device, the value of the resistor of the second biasing circuit is high enough to allow capacitors of the biasing circuit substantially determine the AC potential at the gate terminal of the first MOS device.

19. The differential trans-capacitance amplifier of claim 14 wherein, the amplifier is operable to use input common mode feedback, the drain terminal of the first MOS device is connected to the positive input of the trans-capacitance of the amplifier, the drain terminal of the second MOS device is connected to the negative input of the trans-capacitance of the amplifier, the positive input of the trans-capacitance amplifier is substantially an AC ground, the negative input of the trans-capacitance amplifier is substantially an AC ground, the second capacitor of the first biasing circuit connects the gate terminal of the first MOS device to an AC ground instead of the drain terminal of the first MOS device, the second capacitor of the second biasing circuit connects the gate terminal of the second MOS device to an AC ground instead of the drain terminal of the second MOS device.

\* \* \* \* \*